(12) United States Patent
Smith et al.

(10) Patent No.: US 8,787,593 B1
(45) Date of Patent: Jul. 22, 2014

(54) STATE FEEDBACK FOR SINGLE-VALUED DEVICES WITH MULTIPLE INPUTS

(75) Inventors: Randall B. Smith, Palo Alto, CA (US); John C. Tang, Palo Alto, CA (US); Glenn C. Scott, Mountain View, CA (US)

(73) Assignee: Oracle America, Inc., Redwood City, CA (US)

( * ) Notice: Subject to any disclaimer, the term of this patent is extended or adjusted under 35 U.S.C. 154(b) by 1664 days.

(21) Appl. No.: 10/860,531

(22) Filed: Jun. 2, 2004

(51) Int. Cl.
*H03G 3/00* (2006.01)

(52) U.S. Cl.
USPC ............. 381/104; 381/105; 381/119; 345/82; 327/355; 700/53; 340/584

(58) Field of Classification Search
USPC ................. 381/104, 119, 108, 107, 105, 109; 345/76, 82, 55; 327/306, 363, 355, 327/334; 700/65, 56, 1, 53, 28; 340/584
See application file for complete search history.

(56) References Cited

U.S. PATENT DOCUMENTS

| | | | |
|---|---|---|---|
| 5,799,281 A * | 8/1998 | Login et al. .................... 705/1.1 |
| 7,200,451 B2 * | 4/2007 | Mehta et al. .................... 700/83 |
| 7,242,990 B2 * | 7/2007 | Suyama et al. ................. 700/94 |
| 7,245,727 B2 * | 7/2007 | Cresci et al. ................... 381/119 |
| 2004/0059815 A1 * | 3/2004 | Buckingham et al. ........ 709/224 |
| 2005/0021190 A1 * | 1/2005 | Worrell et al. .................... 701/1 |
| 2005/0149215 A1 * | 7/2005 | Deshpande ..................... 700/94 |
| 2005/0240312 A1 * | 10/2005 | Terry et al. .................... 700/276 |

* cited by examiner

*Primary Examiner* — Vivian Chin
*Assistant Examiner* — Con P Tran
(74) *Attorney, Agent, or Firm* — Osha Liang LLP

(57) ABSTRACT

An apparatus for controlling a target device including a first input device configured to provide a first input to the target device, a second input device configured to provide a second input to the target device, and a control mixer configured to generate an output using a policy, the first input and the second input, wherein the output comprises a feedback and a target device output, wherein the feedback comprises some function of the state of the target device, the policy, and the state of each input device connected to the control mixer.

14 Claims, 3 Drawing Sheets

STATE FEEDBACK FOR SINGLE-VALUED DEVICES WITH MULTIPLE INPUTS

BACKGROUND

In this age of networked systems, many different devices are connected via computer networks, allowing more opportunities for devices to be controlled remotely (i.e., without physically manipulating the device). Additionally, one single-valued (i.e., determines one output) physical input device may receive inputs from multiple sources.

In this setting, remote users of physical input devices (i.e., users located away from the input devices (not physically manipulating a local device)) may not be aware of status changes by a local user to the physical input devices. Similarly, local users of physical input devices may not be aware of any changes made by remote users to the same device. For example, consider a physical input device that controls the temperature of a room. If the user within the room (i.e., a local user) is unaware of a change invoked by a remote user (e.g., at a remote monitoring station), the local user may not be aware of the change and may manipulate the physical input device again. The result of such control changes may be undesirable as long as the users are unaware of each other's input settings. Generally, when more than one input device may be used to affect a single output value, users may find it difficult to know the state of the other input devices and the actual output value determined.

In some instances, physical input devices may be stateless input devices. Stateless input devices are devices which do not visibly indicate to a user that the status of the stateless input device has been changed. For example, a knob which controls volume on a stereo may be stateless if, when the knob is turned to change the volume, there is no visual indication on the knob signifying that the volume has been changed (e.g., if the knob does not have a tick mark indicating the orientation of the knob). Reflecting changes in the status of stateless input devices is more difficult in a remote environment because visual feedback, for example, from the volume knob, is not available to local and/or remote users.

As controls of physical input devices become more virtualized and distributed, knowing the state of all the controls for multiple users is important. Conventionally, to allow visual feedback of the status of a physical input device, a motor may be added to the input device. This motor may drive the orientation of the physical input device to reflect the changes commanded by the remote user. For example, a motor may be added to control the position of a volume knob. By doing so, changes made by a remote user can be reflected to the local user by the shift in the position of the volume knob. Moreover, the motor may be replicated on the remote input device (e.g., a remote control, a computer screen with graphical views of the volume knob, etc.) so that the remote user also receives visual feedback.

SUMMARY

In general, in one aspect, the invention relates to an apparatus for controlling a target device comprising a first input device configured to provide a first input to the target device, a second input device configured to provide a second input to the target device, and a control mixer configured to generate an output using a policy, the first input and the second input, wherein the output comprises a feedback and a target device output, wherein the feedback comprises some function of the state of the target device, the policy, and the state of each input device connected to the control mixer.

In general, in one aspect, the invention relates to a method to control a target device comprising obtaining a first input from a first input device, obtaining a second input from a second input device, and combining the first input and the second input using a control mixer and a policy to obtain an output, wherein the output comprises a target device output and a feedback.

Other aspects of the invention will be apparent from the following description and the appended claims.

DETAILED DESCRIPTION

Figure 1:
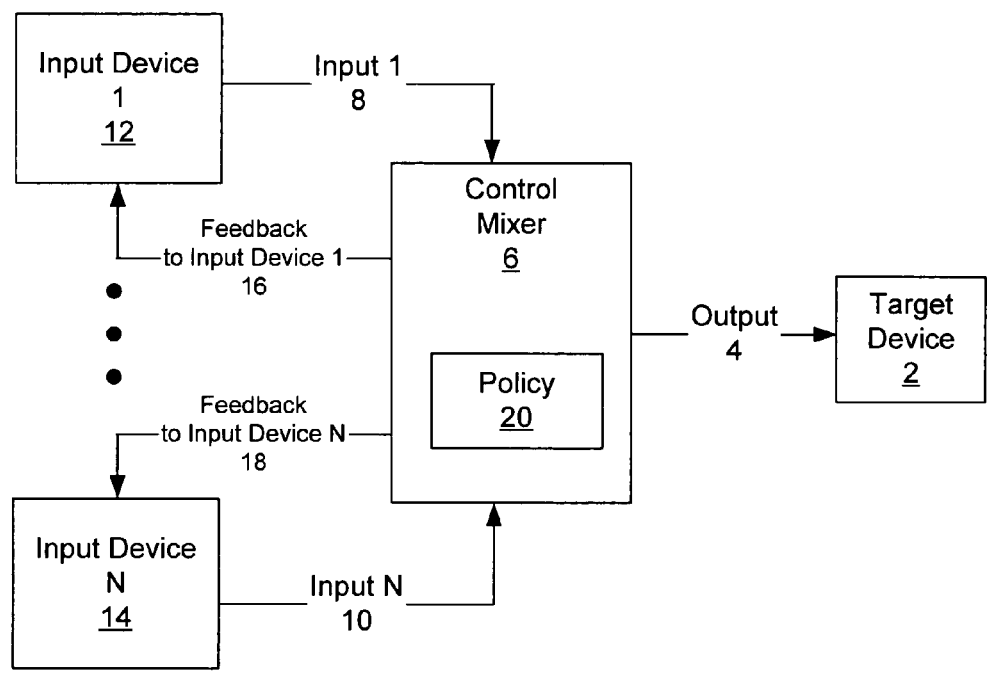
FIG. 1 shows a flow diagram for controlling a target device in accordance with an embodiment of the invention.

Specific embodiments of the invention will now be described in detail with reference to the accompanying figures. Like elements in the various figures are denoted by like reference numerals for consistency.

In the following detailed description of embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

In general, embodiments of the invention relate to an enhanced method to indicate the status of remotely controllable physical input devices to multiple users. More specifically, embodiments of the invention relate to allowing both local and remote users to have access to control actions and visual feedback indications for physical input devices, where the control actions and visual feedback are closely integrated on the physical input device. More specifically, embodiments of the invention relate to using software to make the control and visual indications of physical input devices more symmetric to both local and remote users.

FIG. 1 shows a flow diagram for controlling a target device (2) in accordance with one embodiment of the invention. In one embodiment of the invention, the target device (2) may receive input from a control mixer (6). The control mixer (6) is software that takes inputs (i.e., input 1 (8), input N (10)) from multiple physical input devices (i.e., input device 1 (12), input device N (14)) and determines a single output (4) value using a policy (16). The output (4) is subsequently used as the input to the target device (2). The target device (2) may be any device that is capable of receiving input from multiple users. For example, typical target devices (2) may include a volume knob, a joystick, switches, sliders, etc.

In one embodiment of the invention, multiple input devices (12, 14) are connected to the control mixer (6) and may be manipulated by a user. The user may be local (i.e., near the target device) or remote (i.e., located away from the target device (not physically manipulating the target device). For example, a remote user may control the target device via control actions using the Internet, a remote control, a graphical program, etc.

In one embodiment of the invention, as mentioned above, the control mixer (6) includes a policy (20) that determines the output (4) of the control mixer (6). The policy (20) may be set at any time prior to when an input (8, 10) is received by the control mixer (6) and may be changed by an administrator. For example, the policy may be an averaging policy that takes the average value of all the inputs, a most recent policy that outputs the most recent input value, or a prioritizing policy that selects one input device to take priority over all the other input devices. One skilled in the art will appreciate that several other types of policies may exist that may be implemented in the control mixer (6).

Continuing with FIG. 1, in addition to determining a single output value based on a policy, the control mixer (6) also outputs feedback (16, 18) to all the input devices (12, 14). In one embodiment of the invention, the feedback (16, 18) forwarded to the input devices (12, 14) may include the output (4) determined by the control mixer (6), the policy (20) used to determine the output (4), and the state of each of the input devices (12, 14). The state of each of the input devices (12, 14) is the value inputted by each of the input devices (12, 14). For example, consider the case where each input device in FIG. 1 (i.e., input device 1 (12) and input device N (14)) inputs a temperature value into the control mixer (6). If input device 1 (12) inputs a temperature value of 75 degrees, and input device N (14) inputs a temperature value of 70 degrees, the feedback to input device 1 (16) regarding the state of input device N (14) would be 70 degrees. Similarly, the feedback to input device N (18) regarding the state of input device 1 (12) would be 75 degrees.

One skilled in the art will appreciate that when several input devices exist, the state of each input device is reported to all the input devices connected to the control mixer. Additionally, one skilled in the art will appreciate that the feedback output of the control mixer may include any combination of the aforementioned feedback elements. For example, the feedback output of the control mixer may include only the determined output value or only the input state of each of the input devices.

Figure 2:
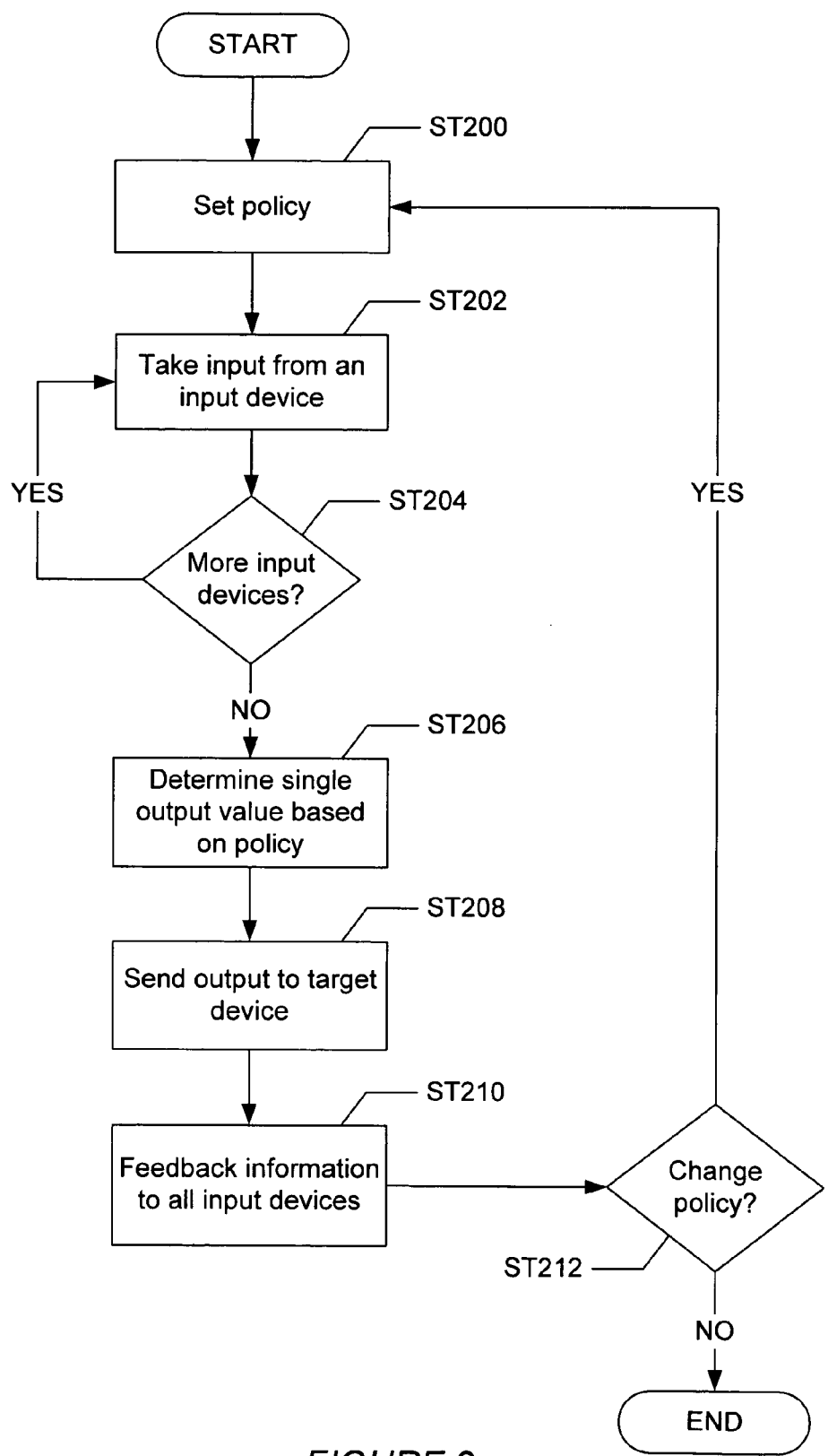
FIG. 2 shows a flow chart for controlling a target device in accordance with an embodiment of the invention.

FIG. 2 shows a flow chart for controlling the output of the target device in accordance with an embodiment of the invention. One skilled in the art will appreciate that the process shown in FIG. 2 and described below is part of a polling architecture that operates continuously (i.e., the steps of the process loop while the system is active).

Initially, a policy is set (Step 200) which allows the control mixer to determine a single output value after processing all the input values and applying the policy. Subsequently, the control mixer takes an input from an input device that is connected to the control mixer (Step 202). If more input devices exist to take inputs from (Step 204), then the control mixer collects an input value from each of the remaining input devices (Step 202).

Once all the input values have been received by the control mixer, the control mixer determines a single output value based on the policy (Step 206). As noted above, the policy may be any rule to determine a single output value from multiple inputs (e.g., an averaging policy, a most recently changed value policy, a prioritizing policy, etc.). This output value is subsequently sent to the target device (Step 208). For example, if the target is a sound volume, the output determined by the control mixer (i.e., a particular volume setting) is then applied to the sound volume. The control mixer subsequently reflects the state of all the input devices and the output determined by the control mixer to the users of each input device (Step 210). Reflecting the state of all the input devices allows each input device, and therefore the user of each input device, to know the state of all the other users. At this stage, if the administrator (i.e., anyone who manages the control mixer) wants to change the policy used by the control mixer to determine the output (Step 212), then the policy may be changed and Steps 200-212 are repeated with the new policy (i.e., for every group of inputs received by the control mixer). Alternatively, if the policy is not changed, the process ends until the next set of inputs is received by the control mixer.

In one embodiment of the invention, the policy used to determine the output by the control mixer may also be reflected as feedback to each input device. Additionally, each input device may display the feedback received from the control mixer to the user. For example, an input device may include a display screen on which the feedback received by the control mixer may be displayed.

One skilled in the art will appreciate that the feedback of all the input devices may be sent to each input device at any time after the control mixer has collected all the input values. Alternatively, if the feedback reflected to the input devices includes the output determined by the control mixer, then the feedback may be sent after the output is determined. In addition, one skilled in the art will appreciate that the feedback sent to the input devices may be sent in parallel or serially. For example, if several input devices are connected to the control mixer, sending feedback serially may be more efficient.

In one embodiment of the invention, the method described in FIG. 2 may also apply to stateless physical input devices, such as a thumbwheel or a curtain drawstring. For example, software may be used to track the position of a curtain drawstring and the relative position of the curtains. Additionally, the invention may also apply to physical input devices that operate in more than one dimension, such as a trackball. In one embodiment of the invention, the visual feedback and control actions may also represent velocity or acceleration (i.e., derivatives of position), rather than just physical position of a target device.

The following examples show how a control mixer may be used to enable both remote and local users to receive visual feedback of the target device. The following examples describe various embodiments of the invention, but should not be interpreted to limit the invention.

As noted above, in one embodiment of the invention, the control and visual indications of target devices are software driven, rather than physically indicated. For example, instead of indicating the physical orientation of a volume knob using a tick mark on the knob, one embodiment of the invention represents the orientation of the volume knob graphically via software.

Figure 3:
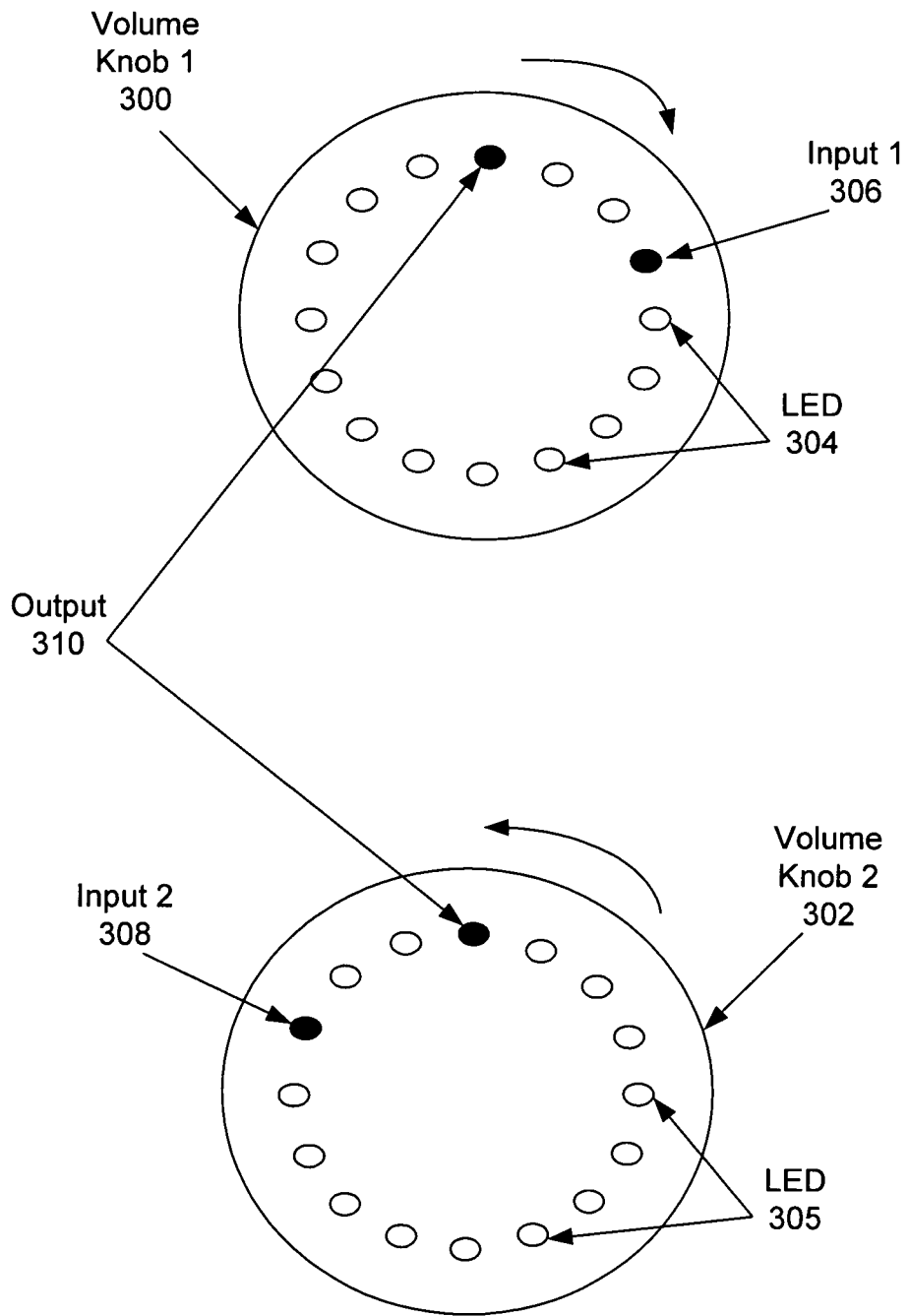
FIG. 3 shows an example of a target device in accordance with an embodiment of the invention.

FIG. 3 shows an example of physically stateless input devices, e.g., two volume knobs (i.e., Volume Knob 1 (300), Volume Knob 2 (302)), both of which control volume on a single stereo system in accordance with one embodiment of the invention. An array of light emitting diodes (LEDs) (304, 305) is shown on both volume knobs (300, 302) to illustrate a software driven orientation of the volume knobs (300, 302). One skilled in the art will appreciate that the LEDs may be replaced by any other computer controlled visual displays to represent the orientation state of each volume knob.

At any given time, an LED is illuminated, indicating the current orientation state of the volume knob. For example, if a local user turns Volume Knob 1 (300), the illuminated LED tracks the movement of Volume Knob 1 (300). In other words, when a local user physically turns Volume Knob 1 (300), the illuminated LED automatically moves with Volume Knob 1 (300) without requiring any additional software control. In this manner, the local user is able to get visual feedback of the effect of turning Volume Knob 1 (300). One skilled in the art will appreciate that a local user gets visual feedback of the effect of turning Volume Knob 2 (302) in the same manner.

The state of each volume knob may also be affected by a remote user (i.e., a user located away from the knob (not physically manipulating knob)) accessing the volume knob from a web browser. For example, if a remote user causes the orientation of volume knob 1 (300) to change by changing a setting on the web browser, the illuminated LED correspondingly "moves" to a new position on Volume Knob 1 (300) to accurately reflect the effect of the remote command. Thus, when a remote user invokes a change in volume, the illuminated LED shifts one position in the array in a counterclockwise or clockwise motion, depending on whether the remote command increased or decreased the volume. One skilled in the art will appreciate that the array of LEDs may be reflected on remote control devices that also have a knob and display associated with them. In this manner, the remote user that invoked the change in volume may also receive visual feedback of the physical input device.

Continuing with FIG. 3, consider the scenario where Volume Knob 1 (300) is manipulated by a local user in a clockwise direction, and Volume Knob 2 (302) is manipulated by a remote user in a counterclockwise direction. The inputs (i.e., Input 1 (306), Input 2 (308)) are illustrated by an illuminated LED. Subsequently, these inputs are applied to a control mixer, allowing the control mixer to determine an output (310) that is also reflected by an illuminating LED. In the example of FIG. 3, the control mixer uses an averaging policy to determine the single output (310) that is used to determine the volume of the stereo system. For example, the inputs (306, 308) by each user (i.e., one in a clockwise direction, the other in a counterclockwise direction) average to the value shown as the output (310). The volume setting specified by the output (310) would subsequently be applied to the stereo system and reflected to both the local user and the remote user by the illuminated LED.

Embodiments of the invention may allow the ability for both local and remote users to receive visual feedback from physical input devices, including stateless input devices. In addition, embodiments of the invention allow a software-driven method to indicate the state for single-valued devices with multiple inputs. As the computer systems become more networked and remote, a system may generate a value based on several inputs, which may include purely virtual input values that are synthetically generated by a software process. In this setting, embodiments of the invention allow a user to be informed regarding the control of a particular target device.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus for controlling a target device with a generated target device output value generated using a plurality of input values, comprising:
    a first physical input device operated by a first user, comprising a first display, and configured to:
        provide a first input value for the target device based on physical contact with the first user, wherein the plurality of input values comprises the first input value and a second input value; and
        display, on the first display, the first input value, the second input value, and the generated target device output value;
    a second physical input device external to the first physical input device, operated by a second user, comprising a second display, and configured to:
        provide the second input value for the target device; and
        display, on the second display, the second input value, the first input value and the generated target device output value; and
    a control mixer external to the first physical input device, external to the second physical input device, and configured to:
        generate the generated target device output value using a policy, the first input value, and the second input value,
            wherein the policy specifies that the generated target device output value is generated by averaging the first input value and the second input value, and
            wherein the generated target device output value does not equal the first input value and the generated target device output value does not equal the second input value;
        apply the generated target device output value to the target device; and
        forward the generated target device output value and the first input value to the second physical input device.

2. The apparatus of claim 1, wherein the first physical input device is a knob.

3. The apparatus of claim 2, wherein the first display comprises a plurality of light emitting diodes (LEDs), and wherein the first physical device is configured to display the first input value and the generated target device output value by:
    illuminating a first LED in the plurality of LEDs corresponding to the first input value; and
    illuminating a second LED in the plurality of LEDs corresponding to the generated target device output value.

4. The apparatus of claim 1, wherein the second user manipulates the second physical input device from a web browser connected to the second physical input device by the Internet.

5. The apparatus of claim 1, wherein the first user is remote with respect to the target device and the second user is remote with respect to the target device.

6. The apparatus of claim 1, wherein the first physical input device is a trackball.

7. The apparatus of claim 1, wherein the first input value and the second input value are temperature values.

8. A method to control a target device with a generated target device output value generated using a plurality of input values, comprising:
    obtaining a first input value from a first physical input device (PID) operated by a first user and comprising a first display,
        wherein the first input value is based on physical contact between the first user and the first PID, and
        wherein the plurality of input values comprises the first input value and a second input value;
    obtaining the second input value from a second PID operated by a second user and comprising a second display, wherein the second PID is external to the first PID;
    combining, by a control mixer and based on a policy, the first input value and the second input value to obtain the generated target device output value,
        wherein the policy specifies that the generated target device output value is generated by averaging the first input value and the second input value, wherein the generated target device output value does not equal the first input value and the generated target device output value does not equal the second input value, and wherein the control mixer is external to the first PID and external to the second PID;

applying, by the control mixer, the generated target device output value to the target device;

forwarding, by the control mixer, the generated target device output value and the first input value to the second PID; and displaying, by the second PID, the second input value, the first input value and the generated target device output value on the second display of the second PID.

9. The method of claim 8, further comprising:

dynamically changing the policy.

10. The method of claim 8, further comprising:

forwarding, by the control mixer, the second input value and the generated target device output value to the first PID; and displaying, by the first PID, the second input value, the first input value and the generated target device output value on the first display of the first PID.

11. The method of claim 8, wherein the first PID is a knob.

12. The method of claim 11, wherein the first display comprises a plurality of light emitting diodes (LED), and wherein displaying the generated target device output value and the first input value comprises:

illuminating a first LED in the plurality of LEDs corresponding to the first input value; and illuminating a second LED in the plurality of LEDs corresponding to the generated target device output value.

13. The method of claim 8, wherein the first PID is a trackball.

14. The method of claim 8, wherein the first input value and the second input value are temperature values.

* * * * *